(12) United States Patent
Attalla et al.

(10) Patent No.: US 8,004,297 B2
(45) Date of Patent: Aug. 23, 2011

(54) ISOLATION CIRCUIT

(75) Inventors: Hani S. Attalla, Boise, ID (US); Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 12/437,175

(22) Filed: May 7, 2009

(65) Prior Publication Data

US 2009/0212810 A1 Aug. 27, 2009

Related U.S. Application Data

(62) Division of application No. 11/529,062, filed on Sep. 28, 2006, now Pat. No. 7,541,825.

(51) Int. Cl.
*G01R 31/3187* (2006.01)

(52) U.S. Cl. .................................. 324/750.3

(58) Field of Classification Search ............ 324/763, 324/765, 158.1; 714/724, 733
See application file for complete search history.

(56) References Cited

U.S. PATENT DOCUMENTS

| | | | |
|---|---|---|---|
| 5,632,040 A * | 5/1997 | Nakajima | 713/322 |
| 6,233,184 B1 | 5/2001 | Barth et al. | |
| 6,351,134 B2 | 2/2002 | Leas et al. | |
| 6,657,453 B2 | 12/2003 | Frankowsky | |
| 6,825,685 B2 | 11/2004 | Cram | |
| 6,852,999 B2 | 2/2005 | Farnworth et al. | |
| 6,859,059 B2 * | 2/2005 | Rohrbaugh et al. | 324/762.02 |
| 6,884,642 B2 | 4/2005 | Farnworth et al. | |
| 6,911,357 B2 | 6/2005 | Devereaux | |
| 6,954,080 B2 | 10/2005 | Whetsel | |
| 7,038,481 B2 | 5/2006 | Marr | |
| 7,043,388 B2 | 5/2006 | Cram | |
| 7,078,926 B2 | 7/2006 | Khandros et al. | |
| 7,088,117 B2 | 8/2006 | Uher et al. | |
| 7,092,826 B2 | 8/2006 | Steele et al. | |
| 7,093,622 B2 | 8/2006 | Cram | |
| 7,106,107 B2 * | 9/2006 | Bhattacharya et al. | 327/77 |
| 7,145,356 B2 | 12/2006 | Sang Gi | |
| 7,170,091 B2 | 1/2007 | Lunde | |

* cited by examiner

*Primary Examiner* — Huy Phan
*Assistant Examiner* — Tung X Nguyen
(74) *Attorney, Agent, or Firm* — Brooks, Cameron, & Huebsch, PLLC (57) ABSTRACT

The present disclosure includes various method, device, and system embodiments for isolation circuits. One such isolation circuit embodiment includes: a first transistor configured for connection to a supply voltage via a first terminal; a register connected to the first transistor; a second transistor in parallel with a resistor, wherein the second transistor is configured for connection to the first terminal, with a gate of the second transistor configured for connection to an output of the register; and wherein the second transistor is configured for connection to a second terminal, the second transistor having a state that depends on a status of the register.

23 Claims, 5 Drawing Sheets

ISOLATION CIRCUIT

PRIORITY INFORMATION

This application is a Divisional of U.S. patent application Ser. No. 11/529,062 filed Sep. 28, 2006 now U.S. Pat. No. 7,541,825, the specification of which is incorporated by reference herein.

TECHNICAL FIELD

The present disclosure relates generally to semiconductor devices and, more particularly, to semiconductor devices having isolation circuitry.

BACKGROUND

Integrated circuit (IC) manufacturers produce die on substrates referred to as wafers. A wafer may contain hundreds of individual die which are often rectangular or square in shape.

Die on a wafer, or unsingulated die, are tested to determine good from bad, e.g., defective or nonfunctional, before the die are singulated and packaged. The earlier a defective die is detected, the fewer subsequent processing steps are performed on the defective die, which results in a reduction of costs associated with individual wafer processing. For instance, often only good die are singulated and packaged into ICs. The cost of packaging die is expensive and therefore the packaging of bad die into ICs increases the manufacturing cost of the IC vendor and can result in a higher cost to the consumer.

Therefore, it is beneficial in semiconductor processing to detect and screen out defective die as early as possible in the manufacturing process. The defects may be introduced at various levels of production. For example, some defects are manifest immediately, while other defects are manifest only after the die has been operated for some period of time.

Figure 1:
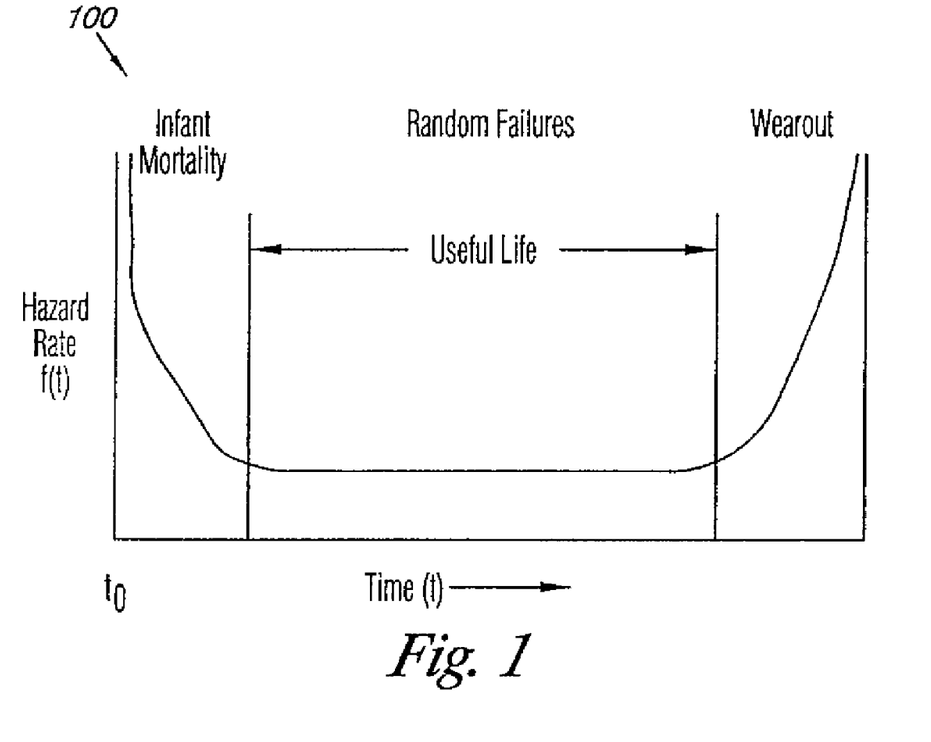
FIG. 1 illustrates a graphical representation of a reliability curve showing a failure rate f(t) as a function of time.

Reliability curves such as that shown in FIG. 1 can be used to express a hazard rate or die failure rate f(t) over time t, and often have a "bath tub" shape. The reliability curve illustrated in FIG. 1 may be divided into three regions as shown: (1) an infant mortality region, (2) a random failures region, and (3) a wearout region.

The infant mortality region begins at time to, which occurs upon completion of the manufacturing process and an initial electrical test. Some die, of course, fail the initial electrical test. Inherent manufacturing defects are generally expected in a small percentage of die, even though the die are functional at time t0.

The relatively flat, bottom portion of the bathtub curve, referred to as the random failure region, represents stable field-failure rates which occur after the die failures due to infant mortalities have been removed and before wearout occurs.

Eventually, as wearout occurs, the failure rate of the die begins to increase rapidly.

To discover those circuits that are susceptible to infant mortality, manufacturing processes have included high temperature testing of die for extended periods of time before shipping products to a customer. Such testing, known as "burn-in," refers to the process of accelerating failures that occur during the infant mortality phase of component life in order to remove the inherently weaker die. Burn-in can occur before or after a die is packaged. Testing of unsingulated die, e.g., die not individually separated from the wafer, can be referred to as wafer-level burn-in (WLB) or wafer-level testing.

During wafer-level testing and/or burn-in, it can be beneficial to isolate defective die, e.g., shorted die, which may draw excessive current. The current drawn by the defective die can result in a reduced supply voltage level and/or current applied to functional die which may share the power supply. Such a reduced supply voltage level can result in reduced voltage uniformity across a wafer and may prevent functional die from being adequately or reliably tested.

Some wafer-level testing methods include using fuses associated with individual dies or groups of die to attempt to isolate defective die. In such methods, the fuse is blown if a die draws an excessive current. Other die isolation testing methods include using an external resistor, e.g., a resistor located off-die, to limit the current drawn by a die to a predetermined value. However, such methods may limit various testing modes by not allowing for multiple different current values used for various different testing modes. Examples of such testing modes may include native testing, built-in self test (BIST), built-in self stress (BISS), design for test (DFT), among other testing modes.

DETAILED DESCRIPTION

The present disclosure describes various method, device, and system embodiments for isolation circuits. The isolation circuits can be used in various applications including the testing of integrated circuit (IC) die.

One isolation circuit embodiment according to the present disclosure includes a first transistor having a source connected to a first terminal, wherein the first terminal connects a supply voltage to the source of the first transistor. A register is connected to the drain of the first transistor. In this embodiment, a second transistor is in parallel with a resistor, a gate of the second transistor is connected to an output of the register and a source of the second transistor is connected to the first terminal. The drain of the second transistor is connected to a second terminal, and the second transistor has a state that depends on whether the register is loaded.

Another isolation circuit embodiment according to the present disclosure includes an on-die resistor stack having an input connected to a first voltage supply pad of a semiconductor die and an output signal connected to a second voltage supply pad of the semiconductor die. The first supply pad is connected to an external power supply. In various embodiments, the resistor stack includes a number of levels including a first level having a first resistor connected to a source of a first transistor, a gate of the first transistor being connected to a first enable input, and a second level having a second resistor connected to a source of a second transistor, a gate of the second transistor being connected to a second enable input. In various embodiments, the first and second enable inputs are controlled to set a resistance value of the resistor stack in order to limit a current value drawn by the die through the resistor stack during a testing operation.

Figure 2A:
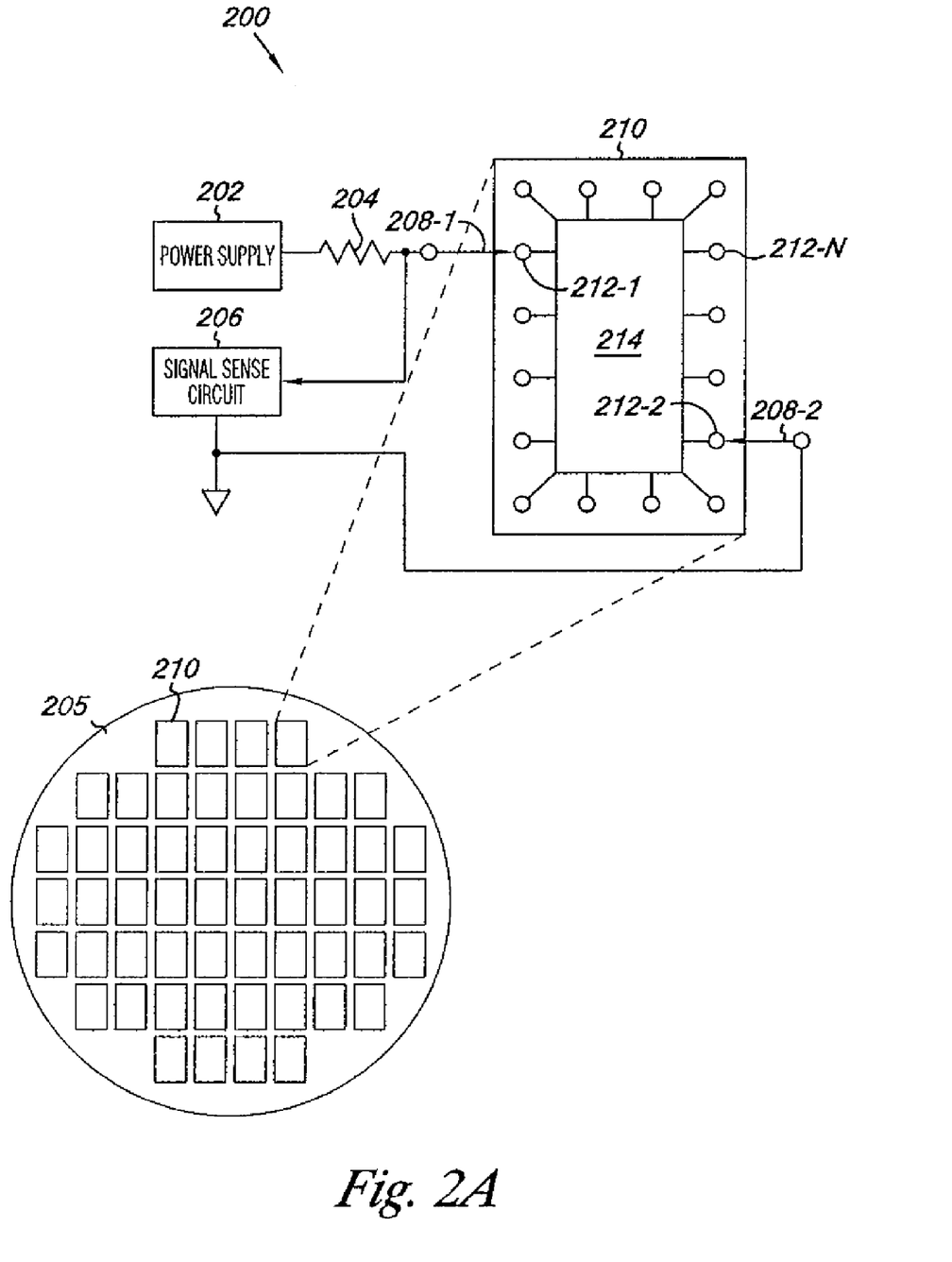
FIG. 2A illustrates a block diagram of a prior art technique for testing an unsingulated semiconductor die of a wafer.

FIG. 2A illustrates a block diagram of a prior art technique for testing an unsingulated semiconductor die 210 of a wafer 205. The testing apparatus 200 shown in FIG. 2A includes a power supply 202 and a signal sense circuit 206. The power supply 202 can produce test signals that may be modified by a driver (shown in FIG. 2B). For example, a driver may be used to amplify a test signal such that the amplified test signal has a larger voltage and/or current than the test signal.

The test signal is delivered to the die 210 via a wafer-level contactor, e.g., a probe, 208-1 that may automatically engage with and disengage from portions of die 210. The die 210 may include an electronic circuit portion 214 and a number of terminals (or pads) 212-1, 212-2, . . . , 212-N. The designator "N" is used to indicate that die 210 can include a number of terminals. The terminals 212-1, 212-2, . . . , 212-N provide input/output (I/O) connections to various nodes of electronic circuit portion 214. As shown in FIG. 2A, the wafer-level contactor 208-1 engages with terminal 212-1 such that the test signal from the power supply 202 (or driver) can be delivered to electronic circuit portion 214 and quality assurance tests can be performed. Depending on the type of test, more than one wafer-level contactor may engage the die 210. In FIG. 2A, two contactors 208-1 and 208-2 are shown for purposes of discussion.

The signal sense circuit 206 can function to monitor the voltage and/or current of signals provided to die 210 during a testing operation to determine whether a die is defective, e.g., nonfunctional. For example, the testing operation may be a short circuit test to determine whether a given terminal such as 212-1 is shorted to another terminal such as a ground terminal, which may cause an excessive current to flow from power supply 202 through a contactor, e.g., contactor 208-1, to die 210.

Figure 2B:
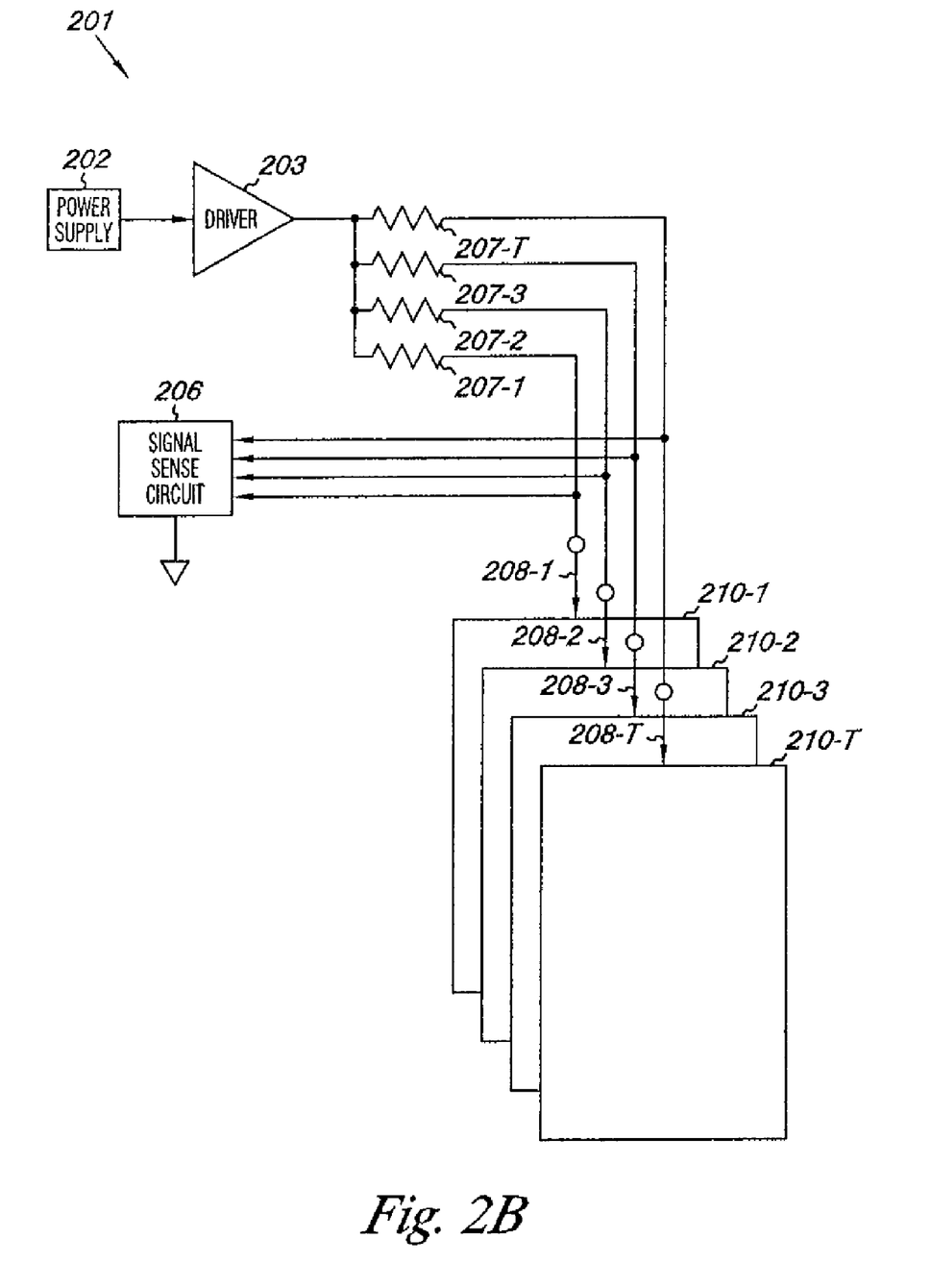
FIG. 2B illustrates a block diagram of a prior art technique for parallel testing a plurality of semiconductor die of a wafer.

FIG. 2B illustrates a block diagram of a prior art technique for parallel testing a number of semiconductor die 210-1, 210-2, 210-3, . . . , 210-T of a wafer, e.g., wafer 205 shown in FIG. 2A. The designator "T" is used to indicate that die 210 can include a number of semiconductor die. It can be desirable to concurrently test, i.e., in parallel, some or all of the die on the wafer in order to increase the efficiency of the testing.

The testing apparatus 201 includes a power supply 202, a driver 203, and a signal sense circuit 206 similar to FIG. 2A. The apparatus 201 also includes a number of external isolation resistors 207-1, 207-2, 207-3, . . . , 207-T. The external isolation resistors can produce respective signals on a plurality of wafer-level contactors 208-1, 208-2, 208-3, . . . , 208-T, which engage respective terminals, e.g., terminals 212-1, 212-2, . . . , 212-N as shown in FIG. 2A, of the dies 210-1, 210-2, . . . , 210-T.

A short circuit existing in a given die, e.g., 210-1, 210-2, . . . , 210-T, may tend to draw significant current from the driver 203, which may be applying test signals to hundreds of die. The current would flow through an isolation resistor, e.g., 207-1, through the short circuit of a die, e.g., 210-1, and into ground (assuming driver 203 produced a test signal having a voltage potential higher than ground). The external isolation resistors 207-1, 207-2, . . . , 207-T can reduce the likelihood of a defect, e.g., a short circuit, in one of the die adversely affecting the testing of other die. That is, the external isolation resistors can reduce the current drawn by a shorted die, which can reduce the degradation of the test signals from the driver and/or power supply.

However, such resistor isolation schemes such as that described in FIG. 2B may not adequately isolate defective, e.g., shorted, die. For instance, external resistors in such isolation schemes may limit current drawn by a shorted die, but may not adequately protect against cratering of a shared power supply, which can adversely affect the quality of test signals to other die. Also, various prior art isolation schemes may not account for variations in current consumption by die during different testing modes. That is, a single isolation resistance value is used for several testing modes. Such schemes may require physically changing or replacing the resistor to account for different modes. Furthermore, prior art isolation schemes may not include isolation circuits that are self-monitoring/self-controlling.

Figure 3:
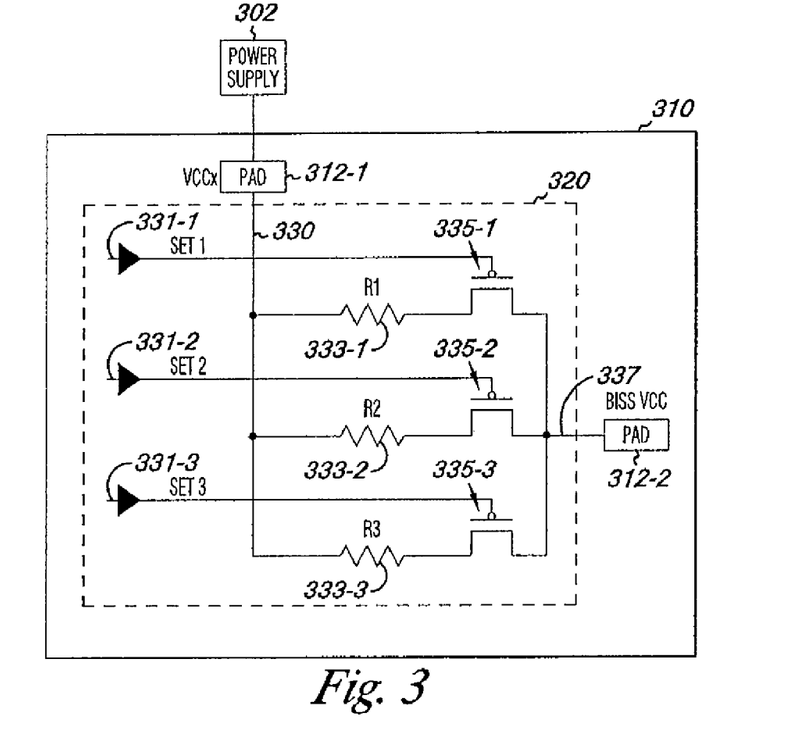
FIG. 3 illustrates a schematic diagram of an isolation circuit according to an embodiment of the present disclosure.

FIG. 3 illustrates a schematic diagram of an isolation circuit according to an embodiment of the present disclosure. In the embodiment illustrated in FIG. 3, the isolation circuit 320 is an on-die isolation circuit, i.e., it is located on semiconductor die 310. The isolation circuit 320 includes a number of resistors 333-1, 333-2, and 333-3 connected to respective transistors 335-1, 335-2, and 335-3. The resistors 333-1, 333-2, and 333-3 have respective resistance values of R1, R2, and R3 as shown in FIG. 3. The transistors can be p-channel, e.g., PMOS, transistors as shown in FIG. 3, or n-channel, e.g., NMOS, transistors.

The respective resistor/transistor pairs (e.g., 333-1/335-1, 333-2/335-2, and 333-3/335-3) form a resistor stack having a number of levels. In this embodiment, the resistor stack is shown as having three levels. Embodiments are not limited to this example. While three resistor/transistor pairs are illustrated in FIG. 3, more or fewer can be used according to various embodiments. The first level includes resistor 333-1 connected to the source of transistor 335-1, the second level includes resistor 332-2 connected to the source of transistor 335-2, and the third level includes resistor 333-3 connected to the source of transistor 335-3. Example suitable resistance values R1, R2, and R3 of resistors 331-1, 331-2, and 331-3 include, but are not limited to, 1 ohm, 2 ohms, or 4 ohms, etc. Also, one or more of resistors 331-1, 331-2, and 331-3 may or may not have the same resistance value.

In this embodiment, the resistor/transistor pair of each level is connected in series and the levels are connected in parallel with each other. However, embodiments of the present disclosure are not so limited to the resistor stack configuration shown in the embodiment of FIG. 3. For instance, embodiments may include resistor stacks having a number of levels including more or fewer than three levels. In some embodiments, not all of the resistor/transistor pairs are connected in series and/or not all of the levels are connected in parallel with other levels.

In various embodiments, the resistance value of the resistor stack is variable and can be set in order to control an amount of current drawn by a die during a testing operation, e.g., a burn-in operation or other testing operation. In the embodiment illustrated in FIG. 3, the resistance value of the resistor stack can be set by controlling, e.g., turning on/off, enable inputs 331-1, 331-2, and 331-3 which are connected to the gates of respective transistors 335-1, 335-2, and 335-3. The enable inputs 331-1, 331-2, and 331-3 can be connected to, and controlled by, registers (not shown) which can be programmed in order to set the resistance value of the resistor stack to an appropriate value. One of ordinary skill in the art will appreciate manners in which registers can be programmed in order to control inputs such as enable inputs 331-1, 331-2, and 331-3. The resistance value of the stack can be set to various values that may range from below one ohm to several ohms or more.

The resistance value of the resistor stack can be set based on a desired voltage and/or current to be delivered to a die, which may depend on a type and/or mode of testing operation to be performed on the die. For instance, current consumption can vary under different modes, e.g., a native mode or an all rows high (ARH) mode, during a burn-in operation, e.g., a wafer-level burn-in (WLB) operation or a built in self-stress (BISS) operation, among other testing operations. Therefore, isolation circuit embodiments of the present disclosure having a variable resistance value, e.g., isolation circuit 320, can accommodate multiple current consumption modes. That is, the current drawn by a given die, through the resistor stack, can be limited to a predetermined value, e.g., by varying the resistance value of the resistor stack, based on a current mode or testing operation.

In various embodiments of the present disclosure, the resistor stack can be connected to one or more die terminals, or pads. In the embodiment illustrated in FIG. 3, an input 330 of the resistor stack is connected to a first voltage supply terminal, e.g., VCCx pad 312-1, which can receive signals from external test circuitry that can include an external driver or power supply, e.g., power supply 302. An output 337 of the resistor stack is connected to a second voltage supply terminal, e.g., BISS VCC pad 312-2 or other burn-in pad. The BISS VCC pad 312-2 can supply signals to BISS circuitry (not shown) during a BISS testing operation. The BISS circuitry may be located on or off die 310. One of ordinary skill in the art will appreciate that die 310 can include various other pads such as a ground pad (e.g., Vss) and/or one or more I/O pads, among other pads for connecting electrical signals to/from one or more dies, e.g., die 310, and/or circuitry thereon.

Various isolation circuit embodiments of the present disclosure, e.g., isolation circuit 320, can allow for the simultaneous burn-in of all or substantially all of the unsingulated die on a fully contacted wafer, regardless of whether some of the dies are defective, e.g., whether the die input pad 312-1 (VCCx) is shorted to another pad such as a ground pad (Vss). In some embodiments, the shorted die, e.g., high current die, of the wafer can be determined prior to executing a WLB or BISS. For instance a pre-burn-in test, e.g., a probe test or other wafer level test, can be performed on the die of the wafer or a voltage differential self detecting circuitry (not shown) can be used to determine the shorted die prior to the burn-in. As such, in various embodiments, the resistance value of the resistance stack can be set, as described above, by controlling, e.g., turning on/of, the transistors 335-1, 335-2, and 335-3.

Therefore, the resistance stack value on shorted die can be set to a first value in order to limit or restrict current to the shorted die as much as possible. Also, the resistance stack value on unshorted die can be set to a second value, e.g., a lower value than the first, in order to provide a desired voltage and/or current to the unshorted die during a burn-in operation. In this manner, the shorted die can be isolated such that they do not significantly affect the voltage supplied to unshorted die during testing operations such as burn-in. As mentioned above, the resistance value of the resistor stack can be varied based on a particular testing mode, e.g., a native mode or ARH mode, among other testing modes.

Figure 4:
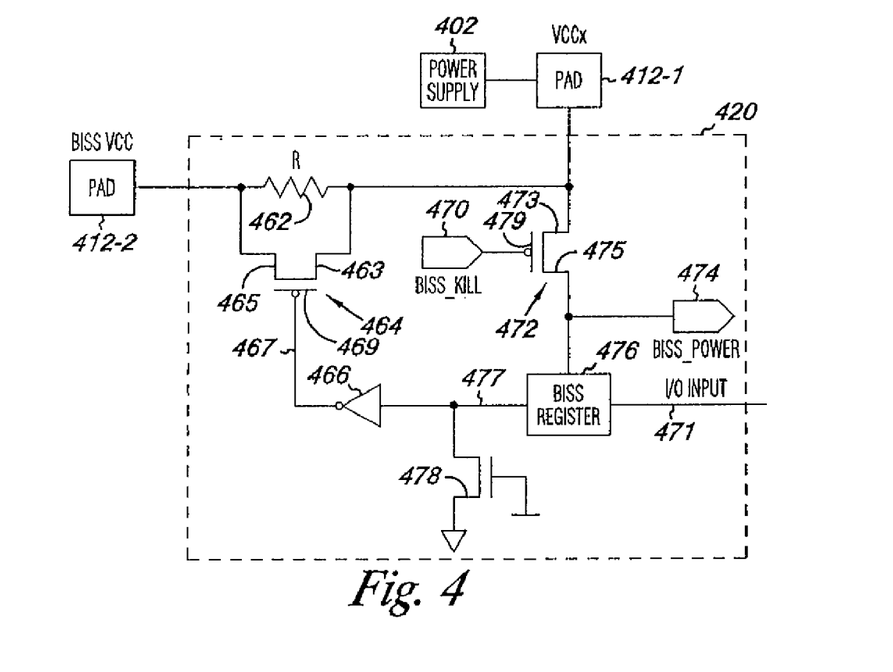
FIG. 4 illustrates a schematic diagram of an isolation circuit according to an embodiment of the present disclosure.

FIG. 4 illustrates a schematic diagram of an isolation circuit according to another embodiment of the present disclosure. In the embodiment illustrated in FIG. 4, the isolation circuit 420 includes a first transistor 472 having its source 473 connected to a first input or terminal 412-1, e.g., a supply voltage pad of a semiconductor die such as a VCCx pad as shown. The pad 412-1 is adapted to connect a supply voltage, e.g., power supply 402, to a source 473 of transistor 472. The isolation circuit 420 includes a register 476 which is powered by power supply 402 and is connected to a drain 475 of resistor 472. A gate 479 of transistor 472 is connected to and controlled by an enable input 470 (shown as BISS_KILL in FIG. 4), which can be used in conjunction with BISS circuitry or other testing circuitry. Embodiments are not limited to a BISS_KILL enable input. In this embodiment, the isolation circuit 420 includes a power output 474, e.g., BISS_POWER, which is connected between the resistor 472 and a register 476. As will be discussed below, output 474 can be used to power testing circuitry to load register 476 when input terminal 412-1 is not shorted.

The embodiment illustrated in FIG. 4 includes a second transistor 464 in parallel with a resistor 462, a gate 479 of transistor 464 being connected to an output of register 476. The first and/or second transistors 472 and 464 can be p-channel, e.g., PMOS, transistors as shown in FIG. 4, or n-channel, e.g., NMOS, transistors according to various design implementations. In various embodiments, and as described below, the output of the register controls the state, e.g., on/off, of transistor 464. For example, the state of transistor 464 can depend on whether register is loaded. That is, whether register is sufficiently powered via terminal 412-1 to be loaded. In some embodiments, and as shown in FIG. 4, transistor 464 can be connected to an output 477 of register 476 via an inverter 466. That is, the transistor 464 can be indirectly and/or directly connected to the output of register 476 dependent on various design implementations. The inverter 466 can be powered by power supply 402, e.g., VCCx.

As illustrated in the embodiment shown in FIG. 4, the output of register 476 is connected to the input of inverter 466, and the output of the inverter 466 is connected to the gate 479 of transistor 464. The source 473 of the second transistor 464 is connected to the first terminal, e.g., VCCx pad 412-1. The drain 475 of transistor 464 is connected to a second terminal, e.g., pad 412-2 (BISS VCC). Although illustrated as PMOS transistors, transistors 464 and/or 472 can be NMOS transistors or other transistors according to various design implementations.

The second terminal 412-2 can be a burn-in pad and can be connected to burn-in circuitry, e.g., BISS and/or BIST circuitry, to perform burn-in testing operations on a die. In various embodiments, the burn-in circuitry can be located on or off a semiconductor die. As will be further discussed below, the state of transistor 464 can depend on whether a short exists at the first terminal, e.g., VCCx pad 412-1. For example, the transistor 464 can be in an off state when a short exists at terminal 412-1 and can be in an on state when terminal 412-1 is unshorted.

Various isolation circuit embodiments of the present disclosure, e.g., isolation circuit 420, can be used in burn-in test applications to test unsingulated semiconductor dies at the wafer level, e.g., when contacting a full wafer. Such embodiments can reduce the current drawn by defective, e.g., short circuited, die to a predetermined value which can reduce or prevent a power supply, e.g., power supply 402, from cratering, e.g., from experiencing a potential level drop that could prevent reliably stressing/testing some of the dies on the wafer.

Isolation circuit embodiments can limit current drawn by defective die on a die-by die basis, which can reduce the number of power supplies and/or drivers used to perform various wafer level tests. For example, in various embodiments, each die of a wafer can have a corresponding isolation circuit, e.g., isolation circuit 420, which may be physically located on each unsingulated die. In such embodiments, current can be limited to each individual die that includes an isolation circuit thereon, rather than being limited to a group, e.g., a row or column, of dies as in some parallel and/or other shared resource testing environments such as that shown in FIG. 2B.

As described previously, in some such testing environments, limiting the current to a shorted die in a row of dies connected to a shared driver can reduce and/or prevent the ability to adequately test and/or determine whether other dies in the particular row are defective. For example, some parallel testing schemes include interconnecting dies via shared buses or traces. In some such schemes, the shorting of one die in the row during testing can prevent an adequate voltage and/or current from being supplied to one or more other dies connected thereto. Such testing environments may also require several power supplies and/or drivers, e.g., a separate driver for each row, column, or group of die on a wafer. Providing many separate power sources increases the number of testing components which can increase costs and/or testing complexity.

Various isolation circuit embodiments of the present disclosure include a current limiting resistor, e.g., 462, connected to a VCC input, e.g., 412-1, of each die on a wafer. In such embodiments, and as illustrated in FIG. 4, the limiting resistor can be connected in parallel to a transistor, e.g., 464. The transistor/resistor (464/462) combination can be controlled such that the transistor is off for defective die, e.g., die that draw current above a certain level such as shorted die, and is on for good die. That is, the state of transistor 464 can determine whether a current drawn by a die is limited predominantly and/or solely by resistor 462, e.g., current does not flow through transistor 464 when in an off state, or whether the current drawn by the die is not limited predominantly and/or solely by resistor 462, e.g., current flows through the transistor/resistor 464/462 combination when transistor 464 is in an on state. In some embodiments, the effective resistance of the transistor/resistor 464/462 combination is below one ohm when transistor 464 is on, e.g., when the die is a good/non-defective die.

Isolation circuit embodiments such as that illustrated in FIG. 4 can be used to concurrently isolate all or substantially all die on a wafer during a full wafer contact by limiting current solely with a resistor, such as resistor 462 on each die for shorted die and limiting current with a lesser resistance value, such as the resistor/transistor 462/464 combination on each die for unshorted die. In various embodiments, dies that include an isolation circuit, e.g., isolation circuit 420, thereon, can be considered self-isolating and/or self-controlling dies. For instance, when circuit 420 is on a die, each isolation circuit can limit the current to shorted die internally, e.g., without the use of external processes or intervention by a controller of a testing system. In other words, the isolation circuit is self-monitoring.

As mentioned above and as shown in the embodiment illustrated in FIG. 4, various isolation circuit embodiments include a register 476 whose output can control the state of transistor 464, e.g., whether the effective resistance of the transistor/resistor 464/462 combination is the value of resistor 462 (shown as R) or whether the effective resistance is a lesser value than R. That is, whether transistor 464 is off or on, respectively. In various embodiments, the register is powered by the die VCC, e.g., power supply 402 via a VCCx input pad 412-1 as shown in FIG. 4. The register 476 can be loaded via an input/output (I/O) signal 471. The I/O signal 471 can be connected to testing circuitry, e.g., BISS circuitry, which can be powered by output 474. In various embodiments, the register is not loaded if output 474 is insufficient to power the testing circuitry.

Suitable resistance values of resistor 462 include 3 ohms, 5 ohms, and 7 ohms, among various other values. The value of resistor 462 can be a value such that the voltage level drop experienced by a good die, e.g., an unshorted die, during non-testing operations remains above a level that allows register 476 to be powered e.g., loaded so as to turn on transistor 464.

As one of ordinary skill in the art will appreciate, a short circuit existing at the VCCx input 412-1 can prevent the register 476 from being powered up, which can prevent the register 476 from being loaded such that transistor 464 is off. If register 476 is sufficiently powered to be loaded via I/O signal 471, e.g., input 412-1 is not shorted, then the register output signal 477 is high, e.g., a binary 1, such that the transistor 464 is turned on. That is, in this embodiment, the high output signal 477 is inverted via inverter 466 such that the inverter output signal 467 is low, which turns on p-channel transistor 464, in this example. It is noted that it is desirable for the transistor 464 to be turned on in cases in which the input 412-1 is not shorted such that the current drawn by the die, e.g., from pad 412-1 to pad 412-2, is limited by the effective resistance of the transistor/resistor 464/462 combination and not solely by the larger effective resistance 462, shown as R.

On the other hand, if register 476 is not sufficiently powered to be loaded via I/O signal 471, e.g., VCCx input 412-1 is shorted, then it can be desirable for the transistor 464 to be turned off such that the current drawn by the die, e.g., from pad 412-1 to pad 412-2, is limited solely by the resistor 462 and not by the lesser effective resistance of the transistor/resistor 464/462 combination. When the register 476 is not sufficiently powered, the output 477 signal may be floating.

The isolation circuit 420 of the embodiment illustrated in FIG. 4 is configured to prevent the inverter output signal 467 from going low when the register 476 is not sufficiently powered to be loaded, e.g., when the output 477 may be floating. For instance, in this embodiment, the isolation circuit 420 includes an always on weak pull down transistor 478 which is connected between the output signal 477 and the inverter 466. When the output signal 477 is floating, e.g., when a short exists at the input 412-1, the pull down transistor 478 can pull the floating output signal sufficiently low such that the output signal 467 of inverter 466 is high, such that the transistor 464 is in an off state. In this manner, a short at the VCCx input 412-1 prevents the register 476 from being loaded such that the transistor 464 is in an off state and the current drawn to the die is limited solely by resistor 462.

Isolation circuit embodiments according to the present disclosure can decrease the components and/or steps used for various testing operations such as a wafer level test or burn-in and/or other operations in which a full wafer contact may be used. For example, in a wafer level burn-in operation in which each of the unsingulated die includes an isolation circuit, e.g., circuit 420, a single external power source, e.g., power supply 402, can be used to supply a voltage and/or current to sufficiently test all of the die on the wafer. That is, the isolation circuits 420 can prevent shorted dies and/or dies which become shorted during testing, from drawing excessive current such that the single power supply can maintain a sufficient voltage to adequately and reliably test the unshorted die on the wafer.

Various isolation circuit embodiments, e.g., isolation circuit 420, can be used after wafer level testing and/or for purposes other than testing and/or burn-in. For example, isolation circuit 420 can be used to limit current drawn by dies which become defective upon being singulated and/or packaged. Isolation circuit embodiments such as circuit 420 can also be used for end use applications such as when a die is implemented in an electronic device or system, e.g., a computer, a personal digital assistant (PDA), a cellular telephone, a digital camera, or various other electronic devices or systems. For instance, dies which become defective, e.g., short circuit or draw excessive current, can cause damage to electronic components such as another die that shares a bus with the defective die, a processor, or other electronic system component. In such cases, isolation circuits according to embodiments of the present disclosure can act as circuit breakers by shutting down, e.g., limiting the current to the die such that the die is not powered up, an individual die which can reduce and/or prevent harm to other system components.

Figure 5:
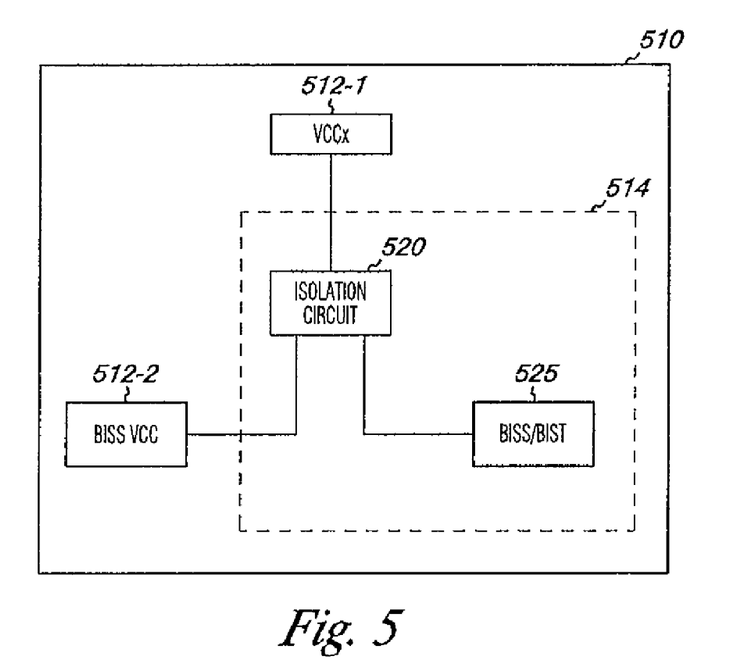
FIG. 5 illustrates a semiconductor die including an isolation circuit according to an embodiment of the present disclosure.

FIG. 5 illustrates a semiconductor die 510 including an isolation circuit according to an embodiment of the present disclosure. The die 510 illustrated in FIG. 5 includes an internal circuit portion 514 that includes an isolation circuit 520, e.g., isolation circuit embodiments as described above in connection with FIGS. 3 and 4. As illustrated in FIG. 5, the isolation circuit 520 can be connected to internal testing circuitry 525, e.g., BISS and/or BIST circuitry as shown.

The die 510 can include a number of inputs, e.g., 512-1 (VCCx) and 512-2 (BISS VCC) which can provide signals to isolation circuit 520 and/or other circuitry that can be included in internal circuit portion 514. Although only two inputs 512-1 and 512-2 are shown in FIG. 5, one of ordinary skill in the art will appreciate that die 510 can include various other inputs, e.g., a ground input and various other I/O inputs. One of ordinary skill in the art will appreciate that die 510 and/or isolation circuit 520 can also be connected to external test circuitry and/or other external components such as one or more power supplies, controllers, etc., which may be used to perform testing operations on die 510.

Figure 6:
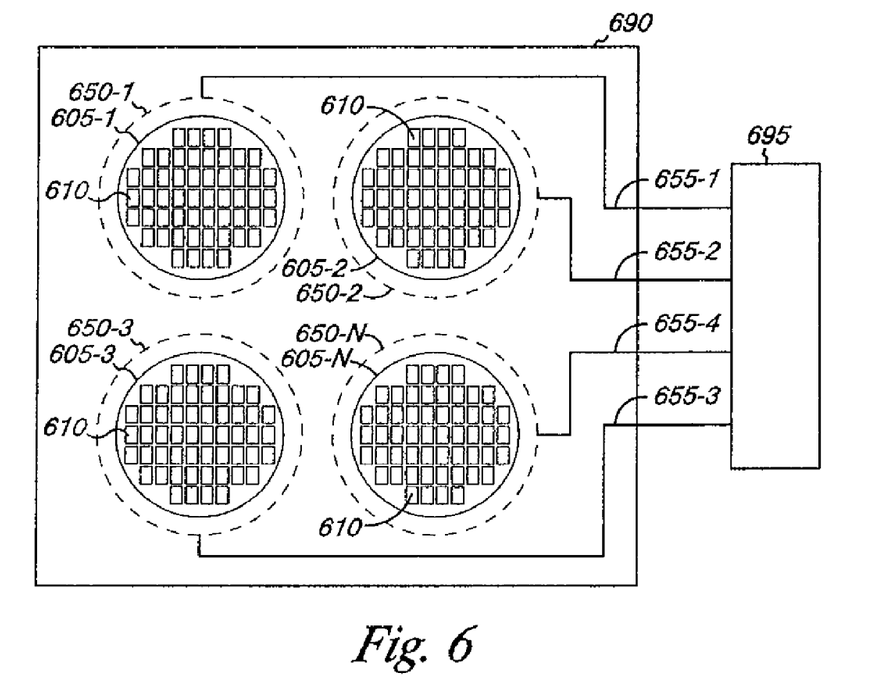
FIG. 6 illustrates a block diagram of a burn-in device/system for testing unsingulated die having an isolation circuit in accordance with an embodiment of the present disclosure.

FIG. 6 illustrates a block diagram of a testing system 600, e.g., a burn-in system, for testing unsingulated die 610 having an isolation circuit in accordance with an embodiment of the present disclosure. As illustrated in FIG. 6, the testing system 600 can include a burn-in board 690 that can receive a number of wafers 605-1, 605-2, 605-3, . . . , 605-N. The designator "N" is used to indicate that burn-in board 690 can receive any number of wafers. Each wafer 605-1 to 605-N can include a number of die 610. The die 610 can include on-die isolation circuits as described above in connection with FIGS. 3-5.

The testing system 600 can include a number of components 650-1, 650-2, 650-3, . . . , 650-N to electrically connect to the on-die isolation circuits. As illustrated in FIG. 6, the testing system 600 can also include test circuitry 695 that can be electrically connected to the number of components 650-1 to 650-N. The test circuitry 695 can provide test signals to components 650-1 to 650-N via respective conductors 655-1, 655-2, 655-3, . . . , 655-N. The components 650-1 to 650-N can be various components capable of electrically connecting simultaneously to all or substantially all of the on-die isolation circuits. For example, components 650-1 to 650-N can be probe cards including probes to contact pads of each die for testing. Components 650-1 to 650-N can also be conductive plane layers that can be similar in size to wafers 605-1 to 605-N and can contact the die pads to provide test signals thereto.

The testing system 600 can be a full wafer contact system in which each individual die 610 can be simultaneously tested and/or burned-in. Suitable full wafer contact methods include, but are not limited to, a probe-per-pad method, a sacrificial method, and a built-in test/burn-in method. The probe-per pad method can include using probes to contact many or all of the pads (not shown) of each individual die 610. The sacrificial method can include depositing a thin layer of metal over the wafers 605-1 to 605-N in patterns that connect together the equivalent bond pads of groups of die on the wafer, so that a reduced number of probe needles may be used to test/stress all the die on the wafer. The built-in test/burn-in method can involve incorporation of an on-die circuit, e.g., circuit 525 shown in FIG. 5, that can facilitate self-testing and/or self-burn-in using a relatively smaller number of probes.

As discussed above in connection with FIGS. 3 and 4, various isolation circuit embodiments of the present disclosure can reduce adverse effects caused by defective dies during wafer level testing and/or burn-in operations. Various isolation circuit embodiments can be provided on-die. Some such embodiments, e.g., isolation circuit 320 in FIG. 3, can include a resistor stack having a variable resistance value that can be set to control an amount of current drawn by a die during a testing operation. In such embodiments, the variable resistance value of the resistance stack can be varied to accommodate current consumption variations under different testing modes.

Various isolation circuit embodiments, e.g., isolation circuit 420 in FIG. 4, can be self-isolating, e.g., each isolation circuit can limit the current drawn by an individual defective die. That is, each isolation circuit can automatically prevent an individual die from being powered up without limiting the current and/or voltage applied to other dies being tested and/or burned-in. Such isolation circuit embodiments can be more efficient and/or effective than other external isolation schemes, e.g., parallel testing and/or shared resource schemes. In such schemes, a die that shorts during testing or burn-in may adversely affect the ability to reliably test and/or determine other dies in a row or group of dies which are connected via a parallel bus structure and/or share a common power source/driver.

Conclusion

Method, device, and system embodiments for isolation circuits have been described. Various isolation circuit embodiments of the present disclosure can be used to reduce and/or prevent adverse effects caused by defective die during various testing and/or burn-in operations. Various isolation circuit embodiments can be located on-die, which can provide benefits such as reducing the complexity of testing circuitry and apparatuses, and reducing the time required to isolate shorted die.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An isolation circuit, comprising:
a first transistor configured for connection to a supply voltage via a first terminal;
a register connected to the first transistor;
a second transistor in parallel with a resistor, wherein the second transistor is configured for connection to the first terminal, with a gate of the second transistor configured for connection to an output of the register;
wherein the second transistor is configured for connection to a second terminal, the second transistor having a state that depends on a status of the register; and
wherein the resistor is connected to the second terminal and the second terminal is coupled to testing circuitry; and wherein the status of the register controls a state of the second transistor such that:
a first amount of current is drawn, in response to a particular potential applied to the first terminal, when a die to which the isolation circuit is connected is a good die; and
a different amount of current is drawn, in response to the particular potential applied to the first terminal, when the die to which the isolation circuit is connected is a bad die.

2. The isolation circuit of claim 1, wherein the first terminal is connected to a source of the first transistor.

3. The isolation circuit of claim 1, wherein the register is connected to a drain of the first transistor.

4. The isolation circuit of claim 1, wherein the first terminal is connected to a source of the second transistor.

5. The isolation circuit of claim 1, wherein the first terminal is connected to a source of the first transistor and to a source of the second transistor.

6. The isolation circuit of claim 1, wherein the first terminal is a supply voltage pad of a semiconductor die.

7. The isolation circuit of claim 1, wherein a short at the first terminal prevents the register from being loaded such that the state of the second transistor is an off state.

8. The isolation circuit of claim 1, wherein the register is loaded when the first terminal is unshorted such that the state of the second transistor is an on state.

9. The isolation circuit of claim 1, wherein the isolation circuit is located on an unsingulated semiconductor die.

10. The isolation circuit of claim 1 wherein the testing circuitry includes at least one of:
built in self stress (BISS) circuitry; and
built in self test (BIST) circuitry.

11. The isolation circuit of claim 1, wherein the gate of the second transistor is connected to an output of an inverter, the input of the inverter being connected to the output of the register.

12. The isolation circuit of claim 1, including a pull down transistor connected to the output of the register.

13. The isolation circuit of claim 1, wherein the first terminal is a first Vcc input terminal of an unsingulated semiconductor die and the second terminal is a second Vcc input terminal of the unsingulated semiconductor die.

14. The isolation circuit of claim 1, wherein the first transistor is a p-channel transistor.

15. An isolation circuit, comprising:
a resistor connected in parallel with a first transistor to a first supply voltage input terminal;
a register having an output connected to a gate of the first transistor, the register connected to the first supply voltage input terminal; and
wherein the resistor is connected to a second supply voltage input terminal, the second supply voltage input terminal coupled to testing circuitry; and wherein a status of the register controls a state of the first transistor such that:
a first amount of current is drawn, in response to a particular potential applied to the first supply voltage input terminal, when a die to which the isolation circuit is connected is a good die; and
a different amount of current is drawn, in response to the particular potential applied to the first supply voltage input terminal, when the die to which the isolation circuit is connected is a bad die.

16. The isolation circuit of claim 15, wherein the register is operable to:
turn the first transistor off when the first supply voltage input terminal is shorted; and
turn the first transistor on when the first supply voltage input terminal is unshorted.

17. The isolation circuit of claim 15, wherein the output of the register is connected to the gate of the first transistor via an inverter.

18. The isolation circuit of claim 15, wherein a first side of the resistor is connected to the first supply voltage terminal and a second side of the resistor is connected to the second supply voltage input terminal.

19. The isolation circuit of claim 18, wherein the second supply voltage terminal is connected to on-die testing circuitry.

20. An isolation circuit, comprising:
a resistor connected in parallel with a first transistor to a first supply voltage input terminal;
a register having an output connected to a gate of the first transistor, the register connected to the first supply voltage input terminal;
a second transistor connected between the first supply voltage input terminal and the register; and
wherein the resistor is connected to a second supply voltage terminal, the second supply voltage terminal coupled to testing circuitry; and wherein a status of the register controls a state of the first transistor such that:
a first amount of current is drawn, in response to a particular potential applied to the first supply voltage terminal, when a die to which the isolation circuit is connected is a good die; and
a different amount of current is drawn, in response to the particular potential applied to the first supply voltage terminal, when the die to which the isolation circuit is connected is a bad die.

21. The isolation circuit of claim 20, wherein a gate of the second transistor is connected to an enable input.

22. The isolation circuit of claim 20, including a pull down transistor connected to the output of the register.

23. The isolation circuit of claim 22, wherein the different amount of current is less than the first amount of current.

* * * * *

UNITED STATES PATENT AND TRADEMARK OFFICE
CERTIFICATE OF CORRECTION

PATENT NO. : 8,004,297 B2  
APPLICATION NO. : 12/437175  
DATED : August 23, 2011  
INVENTOR(S) : Hani S. Attalla et al.

Page 1 of 1

It is certified that error appears in the above-identified patent and that said Letters Patent is hereby corrected as shown below:

In column 11, line 55, in Claim 10, delete "claim 1" and insert -- claim 1, --, therefor.

In column 12, line 64, in Claim 23, delete "claim 22," and insert -- claim 20, --, therefor.

Signed and Sealed this
Eleventh Day of October, 2011

David J. Kappos
*Director of the United States Patent and Trademark Office*